United States Patent
Nishikawa

(10) Patent No.: US 9,064,962 B2
(45) Date of Patent: Jun. 23, 2015

(54) THIN FILM TRANSISTOR ARRAY SUBSTRATE

(75) Inventor: Yasutomo Nishikawa, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 13/991,607

(22) PCT Filed: Dec. 2, 2011

(86) PCT No.: PCT/JP2011/077932
§ 371 (c)(1),
(2), (4) Date: Jun. 4, 2013

(87) PCT Pub. No.: WO2012/077602
PCT Pub. Date: Jun. 14, 2012

(65) Prior Publication Data
US 2013/0256678 A1    Oct. 3, 2013

(30) Foreign Application Priority Data
Dec. 9, 2010 (JP) ................................. 2010-274642

(51) Int. Cl.
| H01L 23/522 | (2006.01) |
| H01L 29/786 | (2006.01) |
| H01L 27/12 | (2006.01) |
| G02F 1/1343 | (2006.01) |
| G02F 1/1362 | (2006.01) |
| G02F 1/1368 | (2006.01) |

(52) U.S. Cl.
CPC ............. *H01L 29/786* (2013.01); *H01L 27/124* (2013.01); *H01L 27/1248* (2013.01); *G02F 1/134363* (2013.01); *G02F 1/136227* (2013.01); *G02F 1/1368* (2013.01); *H01L 23/5226* (2013.01); *H01L 2924/0002* (2013.01)

(58) Field of Classification Search
CPC ............ H01L 27/3248; H01L 23/5226; G02F 1/136227
USPC .......................................................... 438/34
See application file for complete search history.

(56) References Cited

U.S. PATENT DOCUMENTS

2010/0245749 A1* 9/2010 Kimura et al. ................ 349/143

FOREIGN PATENT DOCUMENTS

| JP | 2004-341186 A | 12/2004 |
| JP | 2008-165134 A | 7/2008 |

*Primary Examiner* — Peniel M Gumedzoe
*Assistant Examiner* — Christopher Johnson
(74) *Attorney, Agent, or Firm* — Chen Yoshimura LLP

(57) ABSTRACT

The present invention provides a thin film transistor array substrate that can eliminate short-circuiting between a source electrode and a drain electrode, while ensuring electrical connection between the drain electrode and a pixel electrode. The thin film transistor array substrate has a thin film transistor, a first interlayer insulating film, a lower layer electrode, a second interlayer insulating film, and an upper layer electrode laminated therein in this order. The first interlayer insulating film has a first through hole in a region where the drain electrode of the thin film transistor is disposed, the second interlayer insulating film has a second through hole in a region where the first through hole is disposed, the lower layer electrode has a portion on the first interlayer insulating film and a portion in the first through hole separated from each other, the drain electrode has a portion covered with the first interlayer insulating film, and a portion in contact with a portion of the lower layer electrode in the first through hole, and the portion of the lower layer electrode in the first through hole is in contact with a portion of an upper layer electrode disposed in the second through hole.

2 Claims, 6 Drawing Sheets

THIN FILM TRANSISTOR ARRAY SUBSTRATE

TECHNICAL FIELD

The present invention relates to a thin film transistor array substrate, or more specifically, a thin film transistor array substrate provided with a pair of electrodes capable of applying a voltage to a display medium such as liquid crystals, in a display device such as a liquid crystal display device.

BACKGROUND ART

A thin film transistor array substrate is a substrate with arrays of a large number of thin film transistors (TFTs) on a substrate surface, and is widely used in display devices such as liquid crystal display devices, for example. Liquid crystal display devices that use a thin film transistor array substrate are classified as active-matrix liquid crystal display devices. In typical active-matrix liquid crystal display devices, gate bus lines and source bus lines are provided in a grid pattern orthogonal to each other, and thin film transistors are arranged on respective regions partitioned in a matrix by the gate bus lines and source bus lines. The thin film transistor, which is a switching element, is in an ON state when a scan signal is inputted through a gate bus line to the gate electrode of the thin film transistor. When the thin film transistor is in an ON state, an image signal going through each source bus line is transmitted from the source electrode to the drain electrode of each thin film transistor, and then is further transmitted to a pixel electrode. The image signal inputted to each pixel electrode corresponds to a voltage applied between the pixel electrode provided for each pixel and a common electrode shared by all the pixels. In other words, the image signal corresponds to the voltage applied to the liquid crystal in each pixel. The orientation state of the liquid crystals changes based on the voltage applied to the liquid crystals. This makes it possible for a high resolution image to be displayed by controlling the amount of light that can pass through the liquid crystals for each pixel. This active matrix method is commonly used in televisions, monitors, and the like, which perform displays using a large number of pixels.

As described above, there are various types of conductive members provided on a thin film transistor array substrate. Thus, from the viewpoint of ensuring insulation between the different types of conductive members, increasing the pixel aperture ratio (the area ratio of effective display area), and the like, a method is commonly used in which a plurality of conductive members are laminated via an insulating film. In such a case, the respective conductive members are connected to each other, as necessary, via contact holes. For example, in liquid crystal display devices and the like that use a Fringe Field Switching (FFS) mode, a thin film transistor array substrate provided with pixel electrodes and a common electrode is used. In such a thin film transistor array substrate, a configuration is known in which the pixel electrodes and the common electrode are vertically separated by an insulating film.

Various configurations for an electrical path from the drain electrode of a thin film transistor to the pixel electrode on this type of thin film transistor array substrate have been disclosed (for example, see Patent Documents 1 and 2).

RELATED ART DOCUMENTS

Patent Documents

Patent Document 1: Japanese Patent Application Laid-Open Publication No. 2004-341186

Patent Document 2: Japanese Patent Application Laid-Open Publication No. 2008-165134

SUMMARY OF THE INVENTION

Problems to be Solved by the Invention

In a thin film transistor array substrate provided with pixel electrodes and a common electrode adjacent to each other, a contact hole that goes through a plurality of layers of insulating films is sometimes provided above the drain electrode, in order to connect the pixel electrode and the drain electrode. In this case, the area of the drain electrode needs to be increased in order to ensure an electrical connection with the pixel electrode. However, there are times when space between the source electrode and the drain electrode cannot be sufficiently ensured in order to realize high resolution pixels. In such a case, if the area of the drain electrode is increased, the chance of short-circuiting between the source electrode and the drain electrode increases. This left room for improvement. In the present specification, a source electrode includes not only an electrode portion formed in the thin film transistor, but also a source bus line connected to the electrode portion.

The present invention was made in view of the above conditions, and aims at providing a thin film transistor array substrate that can prevent short-circuiting between a source electrode and a drain electrode, while ensuring electrical connection between the drain electrode and a pixel electrode.

Means for Solving the Problems

The inventor of the present invention has performed a variety of research into a thin film transistor array substrate on which a drain electrode, a first interlayer insulating film, a common electrode, a second interlayer insulating film, and a pixel electrode are layered, and has found that if a contact hole is provided that goes through the first interlayer insulating film and the second interlayer insulating film, and electrically connects the drain electrode to the pixel electrode, then on the basis of conventional setting methods the area of the drain electrode located below the contact hole must be above a certain size in order to ensure contact between the conductive member in the contact hole and the drain electrode. Conversely, the area of the drain electrode must be made smaller in order to enable a higher resolution of the pixels. Thus, the inventor of the present invention has conceived of a configuration in which the area of the drain electrode is made smaller, and in which the common electrode, which is separated from other parts, is arranged inside a contact hole to ensure an electrical connection between the drain electrode and pixel electrode, therefore admirably solving the above-mentioned problems and leading to the present invention.

The present invention is a thin film transistor array substrate provided with: a thin film transistor having a source electrode and a drain electrode; a first interlayer insulating film provided on the source electrode and the drain electrode, the first interlayer insulating film having a first through hole formed within a region where the drain electrode is arranged; a lower layer electrode disposed on a portion of the first interlayer insulating film and within the first through hole; a second interlayer insulating film provided on the first interlayer insulating film and the lower layer electrode, the second interlayer insulating film having a second through hole formed in a region where the first through hole is arranged; and an upper layer electrode provided on the second interlayer insulating film and in the second through hole, wherein a portion of the lower layer electrode provided on the first interlayer insulating film and a portion of the lower layer electrode provided within the first through hole are isolated from each other, wherein the drain electrode has a portion covered by the first interlayer insulating film, and a portion that contacts a portion of the lower layer electrode within the first through hole, and wherein a portion of the lower layer electrode within the first through hole is in contact with a portion of the upper layer electrode arranged in the second through hole.

In the present invention, the source electrode and the drain electrode of the thin film transistor are both arranged below the first interlayer insulating film, and are formed in the same step by a patterning method such as photolithography. Because of this, the smaller the distance is made between the source electrode and the drain electrode in order for the pixels to be a higher resolution, the easier it is for both electrodes to short-circuit. On the other hand, when a contact hole is provided so as to go through the first interlayer insulating film and the second interlayer insulating film, in order for short-circuiting between the lower layer electrode and drain electrode or upper layer electrode to be sufficiently prevented, the side surface of the first through hole provided in the first interlayer insulating film is covered by the second interlayer insulating film. In such a configuration, a first through hole with a large area is necessary in order to ensure an electrical connection between the drain electrode and the upper layer electrode. In conventional configurations, the drain electrode is arranged entirely below the first through hole, so the necessity of having a first through hole with a large area meant that the drain electrode needed a large area. The more the area of the drain electrode is increased, the more the distance between the source electrode and the drain electrode must be reduced. Therefore, on the basis of conventional setting methods, a configuration suitable for preventing short-circuiting between the source electrode and the drain electrode contradicted a configuration for ensuring an electrical connection between the drain electrode and the upper layer electrode.

However, in the present invention, by placing the lower layer electrode, which was conventionally arranged on the first interlayer insulating film, in the first through hole as a portion that is independent from the portion on the first interlayer insulating film, the area of the drain electrode in a region where the first through hole is formed can be made smaller. The drain electrode and the portion of the lower layer electrode in the first through hole connect electrically, and the portion of the lower layer electrode inside the first through hole connects with the upper layer electrode.

Effects of the Invention

According to the thin film transistor array substrate of the present invention, short-circuiting between a source electrode and a drain electrode can be prevented, while ensuring electrical connection between the drain electrode and a pixel electrode.

DETAILED DESCRIPTION OF EMBODIMENTS

Embodiment 1

Figure 1:
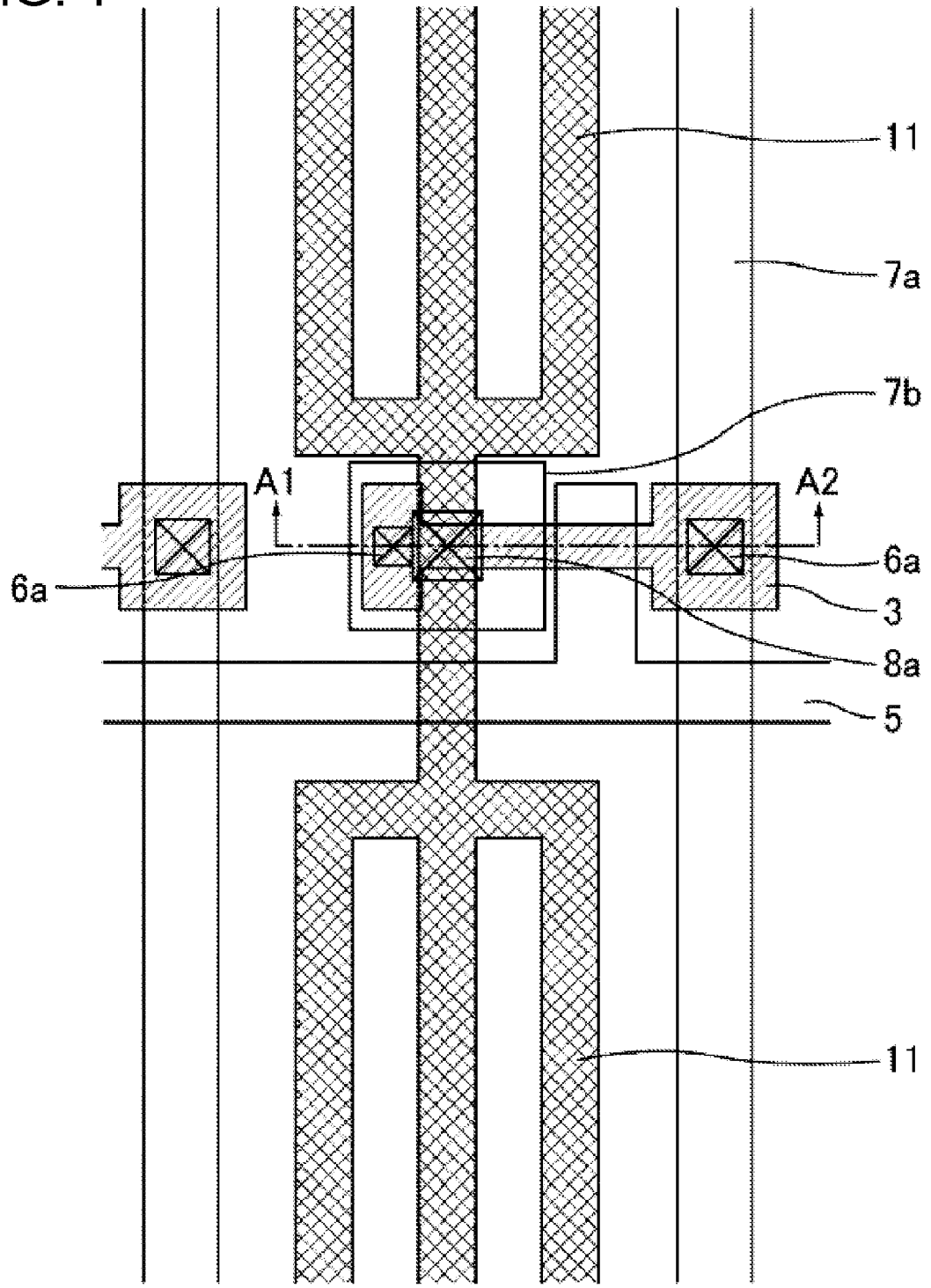
FIG. 1 is a schematic plan view showing a configuration of a thin film transistor array substrate of a comparison example.
Figure 2:
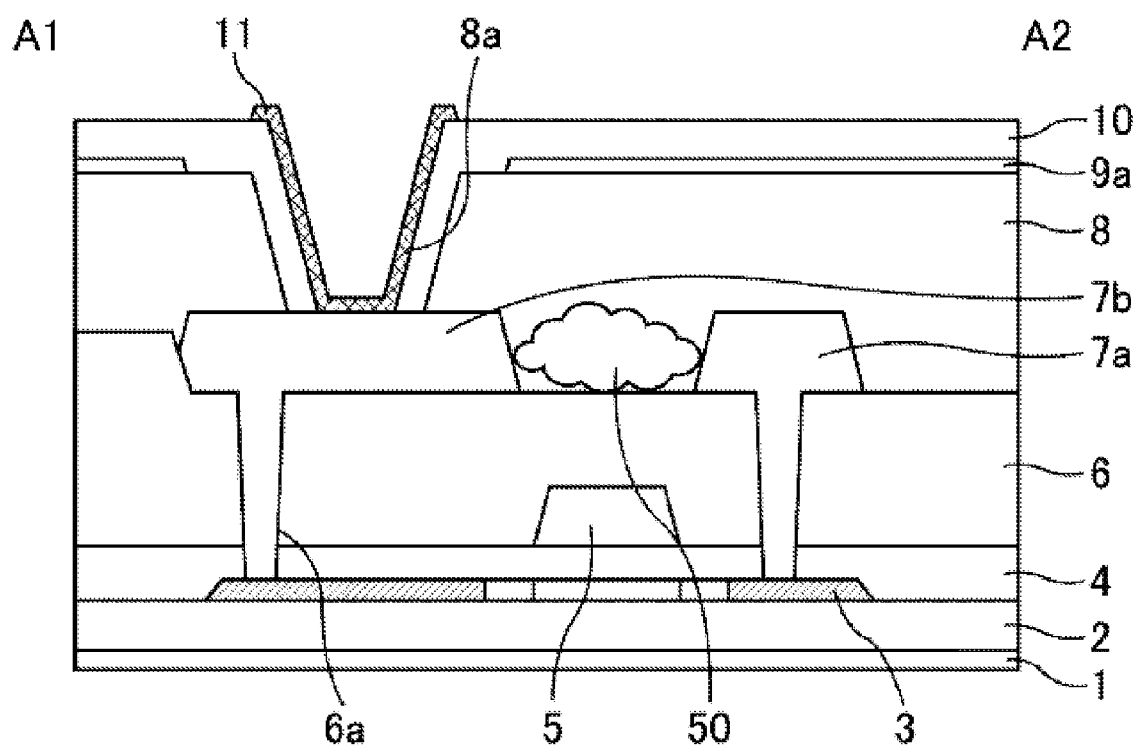
FIG. 2 is a schematic cross-sectional view showing a cross-section of the thin film transistor array substrate along the A1-A2 line in FIG. 1.
Figure 3:
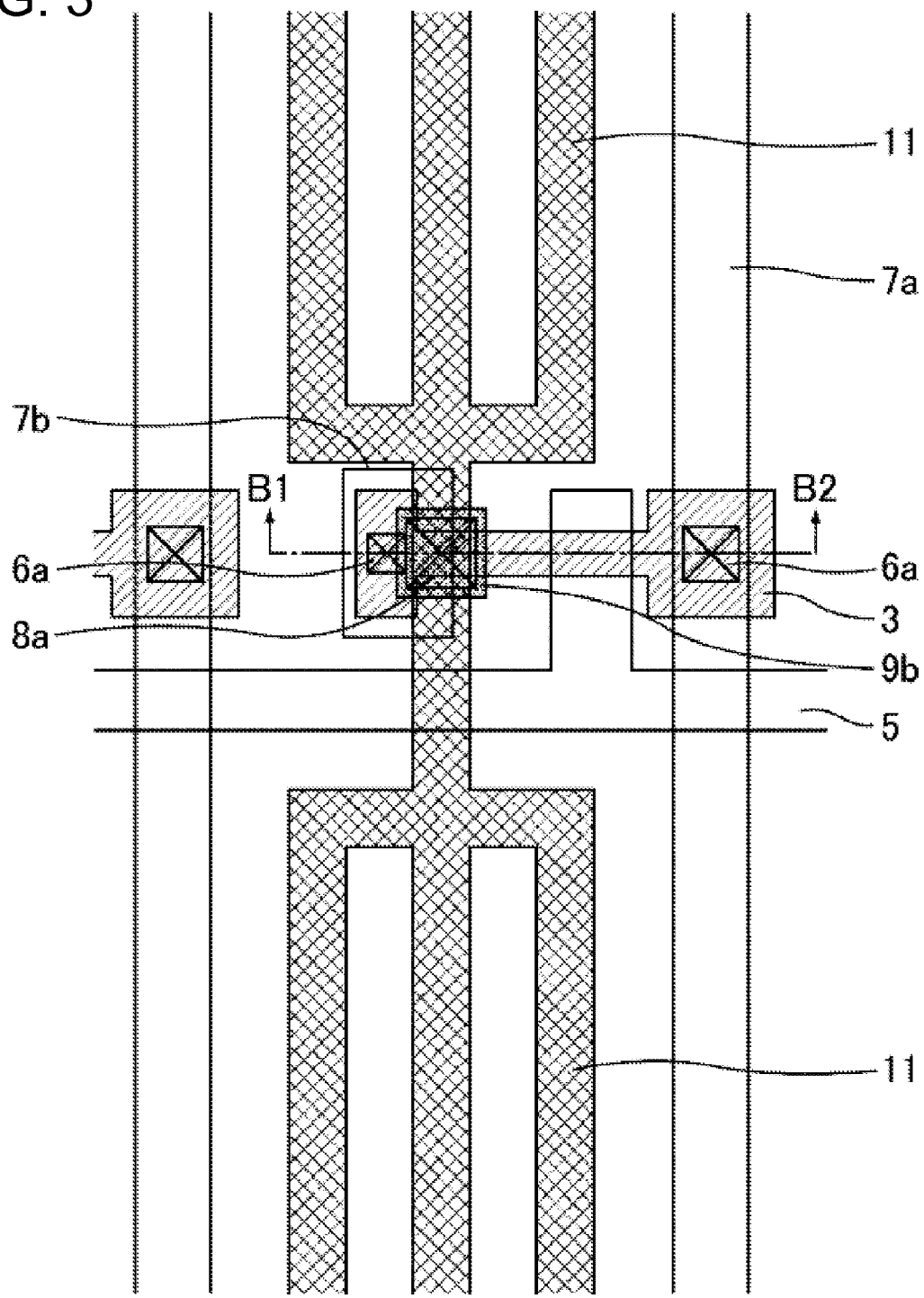
FIG. 3 is a schematic plan view showing a configuration of the thin film transistor array substrate of Embodiment 1.
Figure 4:
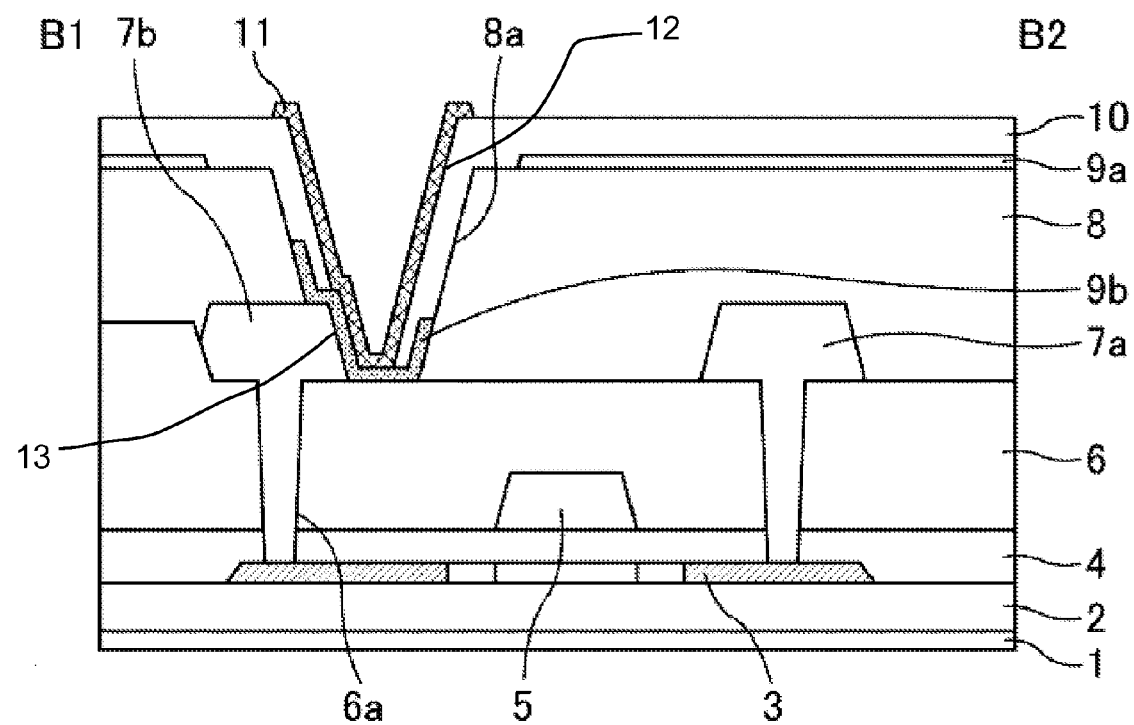
FIG. 4 is a schematic cross-sectional view showing a cross-section of the thin film transistor array substrate along the B1-B2 line in FIG. 3.

FIG. 1 is a schematic plan view showing a configuration of a thin film transistor array substrate of a comparison example. FIG. 2 is a schematic cross-sectional view showing a cross-section of the thin film transistor array substrate along the A1-A2 line in FIG. 1. FIG. 3 is a schematic plan view showing a configuration of the thin film transistor array substrate of Embodiment 1. FIG. 4 is a schematic cross-sectional view showing a cross-section of the thin film transistor array substrate along the B1-B2 line in FIG. 3. The thin film transistor array substrate of the comparison example was not disclosed in the related art, but rather was created by the inventor of the present invention for contrast with the thin film transistor array substrate of the present embodiment.

The thin film transistor array substrate of the comparison example and of the present embodiment are incorporated into a liquid crystal display device, and a liquid crystal display panel can be fabricated by bonding the thin film transistor array substrate and a color filter substrate together, and sealing a liquid crystal layer between the substrates, for example. As shown in FIGS. 1 to 4, pixel electrodes 11 and a common electrode 9a are both provided on the thin film transistor array substrate of the comparison example and of the present embodiment, and it is possible to generate an electric field parallel to the substrate due to these pixel electrodes 11 and common electrode 9a. This type of thin film transistor array substrate is preferably used in transverse electrical field liquid crystal display devices, which drive the liquid crystal molecules in a plane mainly parallel to the substrate surface. The transverse electrical field method includes modes such as Fringe Field Switching (FFS), for example.

As shown in FIGS. 1 and 2, according to the comparison example, it is necessary to form a contact hole 8a that goes through two layers, which are a transparent resin film 8 and an interelectrode insulating film 10, above the drain electrode 7b for connection of the pixel electrode 11 and the drain electrode 7b. It is necessary to ensure a large area of the drain electrode 7b in order to ensure the necessary arrangement margin for formation of the contact hole 8a. Because of this, when a higher pixel resolution is to be achieved, it is difficult to ensure a sufficient space between the source electrode 7a and the drain electrode 7b on the same layer. Therefore, as shown in FIG. 2, there is a risk of the source electrode 7a and the drain electrode 7b short-circuiting due to a conductive foreign object 50 being mixed into the space between the source electrode 7a and the drain electrode 7b. Furthermore, since the source electrode 7a and the drain electrode 7b are respectively formed by patterning a single conductive film, there is a risk that residual film of the conductive film not removed due to patterning defects will cause the source electrode 7a and the drain electrode 7b to be electrically connected.

As a countermeasure, as can be seen by comparing FIGS. 1 and 2 and FIGS. 3 and 4, in the present embodiment the area of the drain electrode 7b is smaller and the distance between the drain electrode 7b and the source electrode 7a is wider than the comparison example. Because of this, it is harder for short-circuiting to occur in the present embodiment between the drain electrode 7b and the source electrode 7a than it is in the comparison example, especially in the case of high resolution pixels.

The size of the contact holes 8a is the same between the present embodiment and the comparison example, but the area of the drain electrode 7b is smaller in the present embodiment than in the comparison example. In the comparison example (the cross-section of FIG. 2), the width of the drain electrode 7b is 12 μm, whereas in the present embodiment (the cross-section of FIG. 4) the width of the drain electrode 7b is 6 μm, for example. Therefore, in the present embodiment, the drain electrode 7b is not arranged on the entire lower surface of the contact hole 8a (the opening formed in the transparent resin film 8), but is arranged so as to occupy half of the lower surface, thereby exposing a side edge 13 of the drain electrode 7b, as shown in FIG. 4. In the present embodiment, the common electrode 9b, which is in an electrically separated state, is formed so as to partially cover the lower surface of the contact hole 8a. The drain electrode 7b and the pixel electrode 11 are not directly connected, but the electrical connection of the drain electrode 7b and the pixel electrode 11 is ensured via the common electrode 9b arranged in the contact hole 8a. Because of this, the area of the drain electrode 7b can be reduced, which allow a sufficient space between the source electrode 7a and the drain electrode 7b. Specifically, in the comparison example, the shortest distance between the drain electrode 7b and the source electrode 7a is 5 μm, whereas in the present embodiment the shortest distance between the common electrode 9b and the source electrode 7a is 7.5 μm. Therefore, in the present embodiment the possibility of display defects occurring due to a leak is reduced.

The common electrode 9b, as described later, is provided after the formation of the transparent resin film 8. Therefore, even if the distance between the common electrode 9b and the source electrode 7a of the present embodiment was equal to the distance between the source electrode 7a and the drain electrode 7b of the comparison example, short-circuiting between the source electrode 7a and the drain electrode 7b can be better suppressed in the present embodiment than in the comparison example. This is because the source electrode 7a and the drain electrode 7b are patterned together by exposure via a mask, whereas the common electrode 9b and the drain electrode 7b are not patterned in the same step, so the common electrode 9b has a lower chance than the drain electrode 7b of short-circuiting with the source electrode 7a. If foreign matter is caught in an opening on the mask, an exposure defect will occur and the source electrode 7a and the drain electrode 7b will short-circuit. However, in the present embodiment the opening on the mask can be made larger than in the comparison example, so the probability of foreign matter getting caught in an opening on the mask and causing an exposure defect can be reduced. Furthermore, if the space between the source electrode 7a and the drain electrode 7b can be made larger, there is also the industrial advantage of being able to perform patterning using a photolithography device with a low limiting resolution.

Because the common electrode 9b is formed of a transparent conductive material, if the area of the drain electrode 7b is reduced, the aperture ratio (the area ratio of effective display area inside the pixel) can be improved.

Next, by describing an example of a method to manufacture the thin film transistor (TFT) array substrate of the present embodiment, the configuration thereof will be made clear.

First, a buffer film 2 (also called a base coat film) is formed on a surface of a glass substrate 1. The buffer film 2 may be a single layer or multiple layers, and a silicon oxide film ($SiO_2$), a silicon nitride film ($SiN_X$), a silicon nitride oxide film (SiNO), or the like is used. A multilayer film containing a silicon oxide film and a silicon nitride oxide film ($SiO_2$/SiNO), or a silicon oxide film ($SiO_2$) is preferably used, for example. The thickness of the buffer film 2 is set at 100 nm to 500 nm, for example. For the deposition method of the buffer film 2, Chemical Vapor Deposition (CVD) is used, for example.

A semiconductor layer 3 used by a pixel TFT and a driving TFT is formed on the buffer film 2. The semiconductor layer 3 is formed by patterning a silicon film such as a continuous grain silicon (CGS) film, a low-temperature polysilicon (LPS) film, or an amorphous silicon (α-Si) film. For the deposition method of the silicon film, CVD is used, for example.

A method for forming the semiconductor layer 3 by depositing a continuous grain silicon film and then patterning the continuous grain silicon film is shown below as an example. First, an amorphous silicon film is deposited on the buffer film 2. Next, a nickel thin film that acts as a catalyst for accelerating crystallization is formed on the surface of the amorphous silicon film. Next, the nickel thin film and the amorphous silicon film are caused to react by laser annealing, and a crystalline silicon layer is formed on the boundary between these. Then, the unreacted portion of the nickel thin film and the portion where nickel silicide has formed are removed by etching or the like. Next, when crystallization is developed by performing laser annealing on the remaining silicon film, a silicon film made from continuous grain silicon is obtained.

Next, a resist pattern is formed on a region of the silicon film corresponding to the region where the source, drain, and channel of the pixel TFT and driving TFT will be formed, and etching is performed with the resist pattern as a mask. By doing this, a semiconductor layer 3 constituting each TFT is obtained.

Next, the semiconductor layer 3 is covered by a gate insulating film formed thereon. The gate insulating film 4 may be a single layer or multiple layers, and a silicon oxide film ($SiO_2$), a silicon nitride film ($SiN_X$), a silicon nitride oxide film (SiNO), or the like is used. A silicon oxide film ($SiO_2$), a silicon nitride film ($SiN_X$), or a multilayer film containing a silicon nitride film and a silicon oxide film ($SiN_X$/$SiO_2$) is preferably used, for example. The thickness of the gate insulating film 4 is set at 10 nm to 120 nm, for example. For the deposition method of the gate insulating film 4, CVD is used, for example. Specifically, if forming a silicon oxide film, a method for performing PECVD by using $SiH_4$ and $N_2O$, or $SiH_4$ and $O_2$ as the starting gas is used, for example.

Next, channel doping is performed on the semiconductor layer 3 in order to adjust the dose of the semiconductor layer 3. Specifically, ion implantation is performed by using a p-type impurity such as boron (B) or indium (In), and by setting the implantation energy to 10 KeV to 80 KeV and the dose to $5 \times 10^{14}$ ions to $2 \times 10^{16}$ ions, for example. At this time, the impurity concentration after implantation is preferably $1.5 \times 10^{20}$ to $3 \times 10^{21}$ (ions/$cm^3$).

Next, a gate electrode 5 is formed. Specifically, first a conductive layer is formed by sputtering, vacuum deposition, or the like, using a metal material that has an element such as Ta, Ti, W, Mo, or Al as the main component. Next, a resist pattern is formed by photolithography on a portion of the conductive layer, overlapping a formation region of the gate electrode, and a gate electrode 5 is formed when etching is performed with the resist pattern as a mask. The gate electrode 5 may be a single layer or multiple layers, and a multilayer film containing a tungsten film and a tantalum nitride film (W/TaN), a molybdenum film (Mo), a molybdenum tungsten film (MoW), or a multilayer film containing a titanium film and an aluminum film (Ti/Al) is preferably used, for example.

Next, ion implantation for forming a p-type diffusion layer is performed. This forms a p-type diffusion layer of a p-type driving TFT. Specifically, first a resist pattern is formed having an opening that overlaps a formation region of the driving TFT p-layer. Next, ion implantation is performed by using a p-type impurity such as boron (B) or indium (In), and by setting the implantation energy to 10 KeV to 80 KeV and the dose to $5\times10^{14}$ ions to $2\times10^{16}$ ions, for example. At this time, the impurity concentration after implantation is preferably $1.5\times10^{20}$ to $3\times10^{21}$ (ions/cm$^3$). After ion implantation, the resist pattern is removed.

Next, ion implantation for forming an n-type diffusion layer is performed. In the present embodiment, this forms an n-type diffusion layer on the driving TFT and pixel TFT. Specifically, first a resist pattern is formed having openings that overlap regions where the source and drain of the n-type driving TFT and the pixel TFT are to be formed. Next, ion implantation is performed by using an n-type impurity such as phosphorous (P) or arsenic (As), and by setting the implantation energy to 10 KeV to 100 KeV and the dose to $5\times10^{14}$ ions to $1\times10^{16}$ ions, for example. Also at this time, the impurity concentration after implantation is preferably $1.5\times10^{20}$ to $3\times10^{21}$ (ions/cm$^3$). After ion implantation, the resist pattern is removed.

The pixel TFT, the p-type driving TFT and n-type driving TFT are fabricated by the above steps. The ion implantation step for forming the p-type diffusion layer is not necessary for liquid crystal panels only driven by n-type TFTs.

In the case of a pixel TFT that requires a low leakage current, an LDD structure may be formed by providing a region on the outside of the channel where phosphorous is implanted at a low concentration.

Next, an interlayer insulating film 6 (an example of an "underlying film") is formed. The interlayer insulating film 6 may be a single layer or multiple layers, and a silicon oxide film (SiO$_2$), a silicon nitride film (SiN$_x$), a silicon nitride oxide film (SiNO), or the like is used. A multilayer film containing a silicon oxide film and a silicon nitride film (SiO$_2$/SiN$_x$), a multilayer film containing a silicon oxide film, a silicon nitride film, and a silicon oxide film (SiO$_2$/SiN$_x$/SiO$_2$), a silicon oxide film (SiO$_2$), or a silicon nitride film (SiN$_x$) is preferably used, for example. For the deposition method of the interlayer insulating film 6, CVD is used, for example. Specifically, if forming a silicon oxide film, a method of performing PECVD by using SiH$_4$ and N$_2$O, or SiH$_4$ and O$_2$ as the starting gas is used, for example.

Furthermore, through holes are formed so as to go through the gate insulation film 4 and the interlayer insulating film 6 and reach the semiconductor layer 3. Specifically, the through holes are formed by forming a resist pattern by photolithography, and by performing etching with the resist pattern as a mask. When forming the source electrode 7a and the drain electrode 7b described later, a conductive material used for the source electrode 7a and the drain electrode 7b is filled into the through holes, thereby forming the contact holes 6a for electrically connecting the semiconductor layer 3 and the source electrode 7a and the drain electrode 7b.

Next, the source electrode 7a and the drain electrode 7b are formed. Specifically, first a conductive layer is formed by sputtering, vacuum deposition, or the like, using a metal material that has an element such as Ta, Ti, W, Mo, or Al as the main component. Preferably used as the conductive layer is a multilayer film containing a titanium film, an aluminum film, and a titanium film (Ti/Al/Ti); a multilayer film containing a titanium film and an aluminum film (Ti/Al); a multilayer film containing a titanium nitride film, an aluminum film, and a titanium nitride film (TiN/Al/TiN); a multilayer film containing a molybdenum film, an aluminum-neodymium film, and a molybdenum film (Mo/Al—Nd/Mo); or a multilayer film containing a molybdenum film, an aluminum film, and a molybdenum film (Mo/Al/Mo), for example. Next, a resist pattern is formed by photolithography to cover portions of the conductive layer where the source electrode 7a and the drain electrode 7b are to be formed, and the source electrode 7a and the drain electrode 7b are formed when etching is performed with the resist pattern as a mask.

Next, a transparent resin film (a planarizing film) 8 is formed for planarizing a surface where the common electrode 9a is to be formed as described below. The transparent resin film 8 needs an opening 8a (an example of a "first through hole") to electrically connect the drain electrode 7b and the pixel electrode 11, which is formed later. By forming the transparent resin film 8 of a photosensitive resin, an opening can be formed by photolithography and etching.

Next, the common electrode (a lower layer transparent electrode) 9a (an example of a "first common electrode") is deposited on the transparent resin film 8 (an example of a "first interlayer insulating film"). At this time, a common electrode 9b (an example of a "second common electrode") is also arranged inside the opening 8a formed in the transparent resin film 8. Specifically, after a single conductive film is formed on the transparent resin film 8 and inside the opening, by patterning the conductive film through photolithography and etching, the common electrode 9a and the common electrode 9b inside the opening are electrically separated. The common electrode 9a is an electrode for changing the orientation of the liquid crystals, and the common electrode 9b is an electrode that makes the drain electrode 7b and the pixel electrode 11, which is formed later, electrically connected. The common electrodes 9a and 9b are preferably made of a transparent conductive material that light emitted from the backlight can pass through, such as indium tin oxide (ITO) or indium zinc oxide (IZO), for example.

Next, the interelectrode insulating film 10 (an example of a "second interlayer insulating film") is formed. The interelectrode insulating film 10 may be a single layer or multiple layers, and a silicon oxide film (SiO$_2$), a silicon nitride film (SiN$_x$), a silicon nitride oxide film (SiNO), or the like is used. For the deposition method of the interelectrode insulating film 10, CVD is used, for example.

Furthermore, in order for the drain electrode 7b and the pixel electrode 11, which is formed later, to be electrically connected, the interelectrode insulating film 10 has an opening 12 (an example of a "second through hole") in a region where the opening 12 provided on the transparent resin film 8 is arranged. If a photosensitive resin is used as the material of the interelectrode insulating film 10, the opening 12 in the interelectrode insulating film 10 can be formed through photolithography and etching.

Next, the pixel electrode (the upper layer transparent electrode) 11 (an example of an "upper layer electrode") is deposited on the interelectrode insulating film 10. At this time, the pixel electrode 11 is also arranged inside the opening 12 formed in the transparent resin film 8 and the interelectrode insulating film 10. The portion of the pixel electrode 11 above the interelectrode insulating film 10 is an electrode for changing the orientation of the liquid crystals by forming a transverse electric field between the common electrode 9a and the pixel electrode 11. The portion of the pixel electrode 11 inside the opening 12 is an electrode for making the drain electrode 7b and the pixel electrode 11 electrically connected. The pixel electrode 11 is preferably made of a transparent conductive material that light emitted from the backlight can pass through, such as ITO or IZO, for example. The pixel electrode 11 can be selectively arranged on the necessary portions by photolithography and etching.

After this, a polyimide film is printed as an alignment film (not shown). By following the above steps, the thin film transistor array substrate of the present embodiment can be manufactured.

Next, after dispersing spherical spacers on the alignment film side of the thin film transistor array substrate described above, the thin film transistor array substrate and the opposite substrate can be uniformly bonded together at a prescribed distance. These substrates hold between the liquid crystal layer, which is mainly composed of liquid crystal molecules.

Next, the liquid crystal panel is completed by respectively attaching a polarizing plate on the front and back of the structure formed by affixing together the thin film transistor array substrate and the opposite substrate.

Furthermore, a backlight unit, various optical films and the like are arranged on the back side of the liquid crystal panel, and various optical films, a touch panel, and the like are formed on the front side (the display surface side) as needed. An external driver circuit is connected to an edge of the liquid crystal panel. The liquid crystal panel, with those fittings complete, is accommodated inside a chassis.

By following the above, a liquid crystal display device is completed which incorporates the thin film transistor array substrate of the present embodiment.

Embodiment 2

Figure 5:
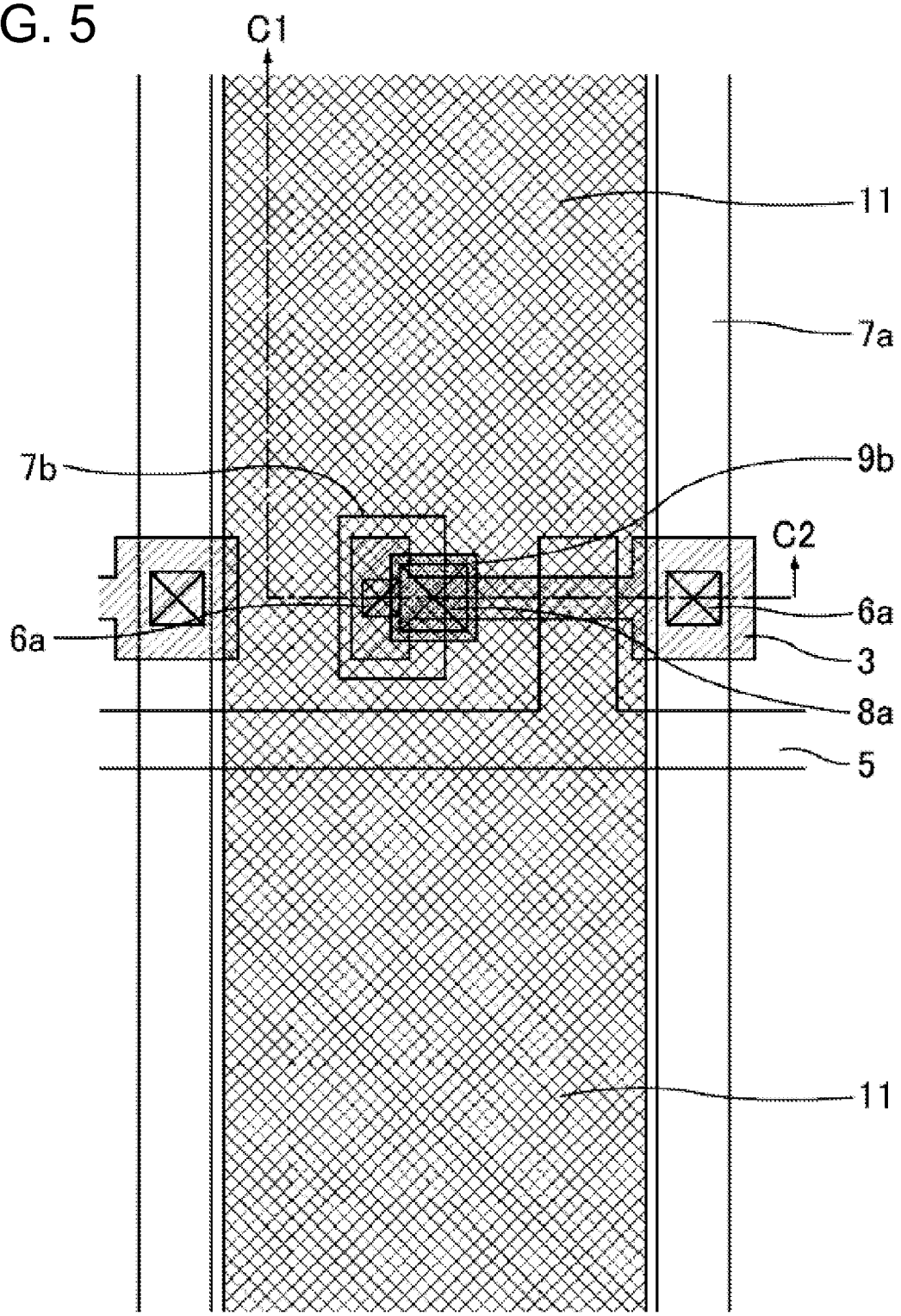
FIG. 5 is a schematic plan view showing a configuration of the thin film transistor array substrate of Embodiment 2.
Figure 6:
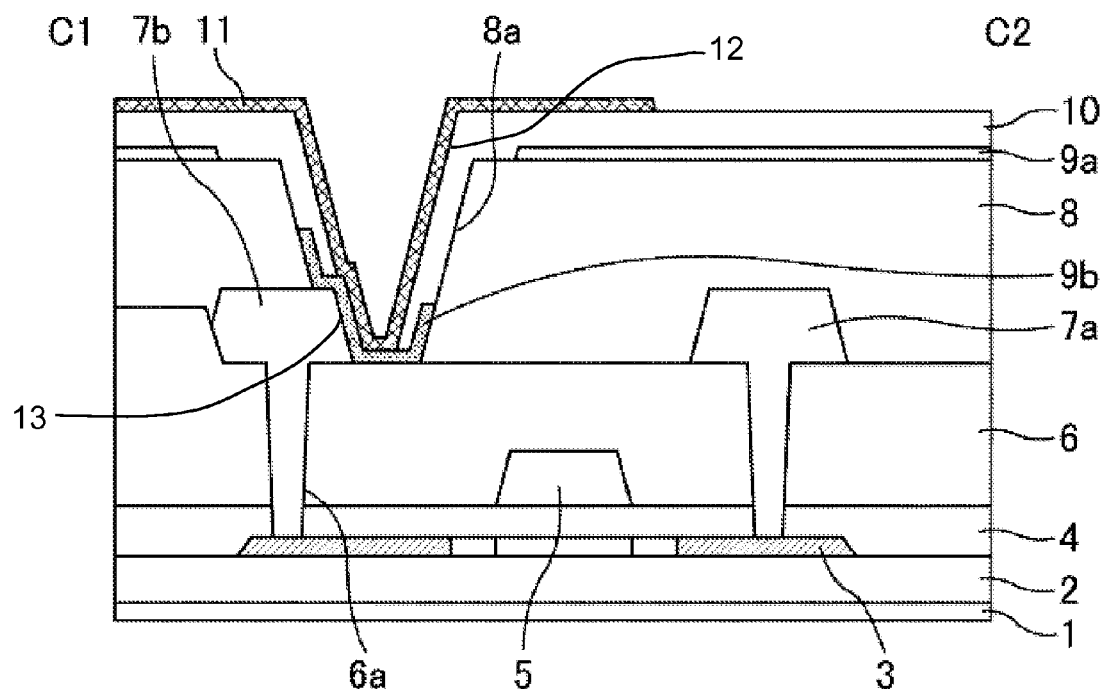
FIG. 6 is a schematic cross-sectional view showing a cross-section of the thin film transistor array substrate along the C1-C2 line in FIG. 5.

The configuration of the thin film transistor array substrate of the present embodiment will be explained below with reference to FIGS. 5 and 6. FIG. 5 is a schematic plan view showing a configuration of the thin film transistor array substrate of Embodiment 2. FIG. 6 is a schematic cross-sectional view showing a cross-section of the thin film transistor array substrate along the C1-C2 line in FIG. 5.

The thin film transistor array substrate of the present embodiment is used in liquid crystal display devices using an Electrically Controlled Birefringence (ECB) mode. In Embodiment 1, a comb-shaped electrode was used as the pixel electrode 11. However, the present embodiment has a structure in which the pixel electrode covers the entire pixel. Furthermore, a common electrode 9a opposes a pixel electrode 11 across an interelectrode insulating film 10, and forms an auxiliary capacitance. According to the thin film transistor array substrate of the present embodiment, similar to Embodiment 1, short-circuiting between a source electrode 7a and a drain electrode 7b can be prevented, while ensuring electrical connection between the drain electrode 7b and a pixel electrode 11.

Various modifications may be made to each embodiment above without departing from the technical spirit of the present invention, and the configurations disclosed in a specific embodiment may be replaced by configurations in another embodiment, or the embodiments may be combined together, for example.

Furthermore, in each embodiment described above, a thin film transistor array substrate was not provided with a color filter, but in the present invention a color filter-on-array method that provides a color filter on the thin film transistor array substrate may be used.

Each embodiment described above is related to a transmissive liquid crystal display device, but the thin film transistor array substrate of the present invention may also use a transmissive method, a reflective method, and a transflective (using both transmission and reflection) method. In transmissive liquid crystal display devices, a backlight is provided on the back side of the liquid crystal display panel, and polarizing plates are respectively provided on the display side and the back side surface of the liquid crystal display panel. In reflective liquid crystal display devices, a reflective thin film is provided on the back side further to the rear than the liquid crystal layer of the liquid crystal display panel, and a circularly polarizing plate is provided on the display side surface of the liquid crystal display panel. The reflective film may be a pixel electrode (a reflective electrode) provided with a reflective surface on the liquid crystal layer side, and if the pixel electrode is a transparent electrode, the reflective film is provided separately from the pixel electrode. Examples of reflective liquid crystal display devices include those that use external light as light for the display, and those provided with a frontlight on a display surface side closer to the display surface side than the liquid crystal layer. Transflective liquid crystal display devices include a method in which a transmissive region that performs transmissive display and a reflective region that performs reflective display are provided inside a pixel, and a method in which a transflective layer is provided inside a pixel. The transmissive region is provided with a transmissive electrode, and the reflective region is provided with a reflective electrode or a laminate containing a transmissive electrode and a reflective film. Furthermore, in transflective liquid crystal display devices, similar to transmissive liquid crystal display devices, in order to perform transmissive display a backlight is provided on the back side of the liquid crystal display panel, and polarizing plates are respectively provided on the display side and the back side surface of the liquid crystal display panel. In order to perform reflective display, a circularly polarizing plate is constituted by attaching a λ/4 retardation plate to at least the polarizing plate of the display side.

The present application claims priority to Patent Application No. 2010-274642 filed in Japan on Dec. 9, 2010 under the Paris Convention and provisions of national law in a designated State. The entire contents of which are hereby incorporated by reference.

DESCRIPTION OF REFERENCE CHARACTERS 1 glass substrate
2 buffer film
3 semiconductor layer
4 gate insulation film
5 gate electrode
6 interlayer insulating film
6a contact hole
7a source electrode
7b drain electrode
8 transparent resin film
8a contact hole
9a, 9b common electrode
10 interelectrode insulating film
11 pixel electrode
50 conductive foreign object

The invention claimed is:

1. A thin film transistor array substrate, comprising:
a thin film transistor having a source electrode and a drain electrode;
a first interlayer insulating film provided on the source electrode and the drain electrode, the first interlayer insulating film having a first through hole formed in a region where the drain electrode is arranged, the first through hole having a bottom that partially exposes a top surface of an underlying layer on which the drain electrode is formed;
a first common electrode disposed on a part of the first interlayer insulating film and a second common electrode disposed within the first through hole;
a second interlayer insulating film provided on the first interlayer insulating film and the first and second common electrodes, the second interlayer insulating film having a second through hole formed within a region where the first through hole is arranged; and
an upper layer electrode provided on the second interlayer insulating film and in the second through hole,
wherein the drain electrode has a portion covered by the first interlayer insulating film, and a portion that is in contact with the second common electrode within the first through hole, and
wherein the second common electrode within the first through hole is in contact with a portion of the upper layer electrode arranged in the second through hole, and is also in contact with the top surface of the underlying layer that is partially exposed at the bottom of the first through hole.

2. A thin film transistor array substrate, comprising:
a thin film transistor having a source electrode and a drain electrode;
a first interlayer insulating film provided on the source electrode and the drain electrode, the first interlayer insulating film having a first through hole formed in a region where the drain electrode is arranged, the first through hole exposing a side edge of the drain electrode;
a first common electrode disposed on a part of the first interlayer insulating film and a second common electrode disposed within the first through hole;
a second interlayer insulating film provided on the first interlayer insulating film and the first and second common electrodes, the second interlayer insulating film having a second through hole formed within a region where the first through hole is arranged; and
an upper layer electrode provided on the second interlayer insulating film and in the second through hole,
wherein the drain electrode has a portion covered by the first interlayer insulating film, and the second common electrode is in contact with said side edge of the drain electrode within the first through hole, and
wherein the second common electrode within the first through hole is in contact with a portion of the upper layer electrode arranged in the second through hole.

* * * * *